United States Patent
Parsons et al.

(10) Patent No.: US 8,351,716 B2
(45) Date of Patent: *Jan. 8, 2013

(54) EFFICIENT ENCODING OF ALTERNATIVE GRAPHIC SETS

(75) Inventors: John E. Parsons, Redmond, WA (US); Joy Chik, Sammamish, WA (US); Nadim Y. Abdo, Bellevue, WA (US); Robert Wilhelm Schmieder, Snoqualmie, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/835,652

(22) Filed: Jul. 13, 2010

(65) Prior Publication Data

US 2010/0278442 A1  Nov. 4, 2010

Related U.S. Application Data (63) Continuation of application No. 11/375,961, filed on Mar. 15, 2006.

(51) Int. Cl.
*G06K 9/36* (2006.01)
*G06K 9/46* (2006.01)

(52) U.S. Cl. .................................................. 382/232

(58) Field of Classification Search .................. None
See application file for complete search history.

(56) References Cited

U.S. PATENT DOCUMENTS

| | | | |
|---|---|---|---|
| 5,060,286 A * | 10/1991 | Miller ........................... | 382/239 |
| 5,083,262 A | 1/1992 | Haff, Jr. | |
| 5,307,055 A * | 4/1994 | Baskin et al. ................. | 345/2.2 |
| 5,339,108 A * | 8/1994 | Coleman et al. ............ | 375/240.2 |
| 5,351,129 A * | 9/1994 | Lai ................................ | 348/584 |
| 5,557,749 A * | 9/1996 | Norris ........................... | 709/228 |
| 5,638,498 A | 6/1997 | Tyler et al. | |
| 5,774,674 A * | 6/1998 | Gutmann et al. ............. | 709/237 |
| 5,802,282 A * | 9/1998 | Hales et al. ................... | 709/204 |
| 5,938,723 A * | 8/1999 | Hales et al. ................... | 709/204 |

(Continued)

FOREIGN PATENT DOCUMENTS

JP  Hei 07-336676  12/1995

(Continued)

OTHER PUBLICATIONS

Supplementary European Search Report cited in Application No. 07716664.3, dated Dec. 27, 2011; 1 page.

(Continued)

*Primary Examiner* — Samir Ahmed
(74) *Attorney, Agent, or Firm* — Merchant & Gould P.C.

(57) ABSTRACT

Embodiments provide for efficient encoding and rendering of remote graphic displays by applying one or more of the following: (1) field encoding for identifying fields of a graphics set such that commonalities of various fields across different graphics languages are identified; (2) resource caching, which treats heterogeneous resources in a homogeneous way when it comes to storing them; (3) determining the type of encoding for remoting items within a graphics set based upon the types of compression mechanisms supported by a remote device; (4) improving responsiveness by rendering with partially sent resources; (5) a mechanism for determining what portions (if any) of a graphics set should be sent to a remote device and in what order; and (6) use of dedicated resources already on a remote device in order to eliminate the transfer of a resource between a local device and the remote device when rendering such resource.

18 Claims, 5 Drawing Sheets

U.S. PATENT DOCUMENTS

| | | | | |
|---|---|---|---|---|
| 5,991,515 A * | 11/1999 | Fall et al. | ................... | 358/1.15 |
| 6,028,965 A * | 2/2000 | Normile | ................... | 382/250 |
| 6,072,508 A * | 6/2000 | Devic | ................... | 345/553 |
| 6,628,833 B1 * | 9/2003 | Horie | ................... | 382/173 |
| 6,662,218 B2 * | 12/2003 | Mighdoll et al. | ................... | 709/219 |
| 6,687,745 B1 | 2/2004 | Franco et al. | | |
| 6,834,297 B1 * | 12/2004 | Peiffer et al. | ................... | 709/219 |
| 6,940,912 B2 * | 9/2005 | Sullivan et al. | ................... | 375/240.26 |
| 6,947,994 B1 * | 9/2005 | Kraslavsky | ................... | 709/230 |
| 6,950,213 B1 * | 9/2005 | Gurevich | ................... | 358/401 |
| 7,010,032 B1 * | 3/2006 | Kikuchi et al. | ................... | 375/240.01 |
| 7,249,196 B1 * | 7/2007 | Peiffer et al. | ................... | 709/246 |
| 7,305,472 B2 * | 12/2007 | Mighdoll et al. | ................... | 709/226 |
| 7,325,045 B1 * | 1/2008 | Manber et al. | ................... | 709/219 |
| 7,433,521 B2 * | 10/2008 | Chen et al. | ................... | 382/232 |
| 7,508,988 B2 * | 3/2009 | Hara et al. | ................... | 382/232 |
| 7,634,011 B2 * | 12/2009 | Sullivan | ................... | 375/240.28 |
| 7,634,574 B2 * | 12/2009 | Senga et al. | ................... | 709/230 |
| 7,647,404 B2 * | 1/2010 | Cooper et al. | ................... | 709/225 |
| 7,693,895 B2 * | 4/2010 | Takayama et al. | ................... | 707/705 |
| 7,702,727 B2 * | 4/2010 | Whynot | ................... | 709/204 |
| 7,975,012 B2 * | 7/2011 | Jennings et al. | ................... | 709/206 |
| 2002/0065952 A1 * | 5/2002 | Sullivan et al. | ................... | 709/328 |
| 2002/0067369 A1 * | 6/2002 | Sullivan | ................... | 345/716 |
| 2002/0093948 A1 * | 7/2002 | Dertz et al. | ................... | 370/355 |
| 2002/0184373 A1 * | 12/2002 | Maes | ................... | 709/228 |
| 2003/0095712 A1 * | 5/2003 | Christ et al. | ................... | 382/232 |
| 2003/0120747 A1 * | 6/2003 | Kim | ................... | 709/217 |
| 2004/0189677 A1 * | 9/2004 | Amann et al. | ................... | 345/660 |
| 2005/0052685 A1 * | 3/2005 | Herf et al. | ................... | 358/1.15 |
| 2005/0201624 A1 * | 9/2005 | Hara et al. | ................... | 382/232 |
| 2005/0228890 A1 * | 10/2005 | Lawrence | ................... | 709/227 |
| 2006/0104369 A1 * | 5/2006 | Kikuchi et al. | ................... | 375/240.28 |
| 2007/0220168 A1 | 9/2007 | Parsons et al. | | |

FOREIGN PATENT DOCUMENTS

| | | |
|---|---|---|
| JP | 2000-511364 | 8/2000 |
| JP | 2003-509785 | 3/2003 |
| JP | 2004-511852 | 4/2004 |
| JP | 2004-318913 | 7/2004 |
| RU | 2120138 | 10/1998 |
| WO | WO 02/31668 | 4/2002 |
| WO | WO 2004/104759 | 12/2004 |

OTHER PUBLICATIONS

Israeli Patent Office Action cited in Israeli Patent Application No. 193515, dated Jan. 11, 2012; 5 pages.

Korean Patent Office Notice of Preliminary Rejection cited in Korean Patent Application No. 10-2008-7022278 (no English translation available), dated Mar. 2, 2012; 3 pages.

Australian 2nd Office Action in Application 2007225421, mailed Jun. 27, 2011, 1 pg.

Australian Examiner's First Report in Application 2007225421, mailed Mar. 23, 2011, 2 pgs.

Australian Notice of Allowance in Application 2007225421, mailed Nov. 2, 2011, 3 pgs.

Chinese 1st Office Action in Application 200780009229, mailed Nov. 27, 2009, 7 pgs.

Chinese 2nd Office Action in Application 200780009229, mailed Sep. 1, 2010, 6 pgs.

Chinese Notice of Allowance in Application 200780009229, mailed Jan. 7, 2011, 4 pgs.

European Supplemental Search Report in Application 07716664.3, mailed Dec. 7, 2011, 6 pgs.

Japanese Final Notice of Rejection in Application 2009500354, mailed Dec. 6, 2011, 2 pgs.

Japanese Notice of Rejection in Application 2009500354, mailed Jul. 19, 2011, 4 pgs.

PCT International Search Report and Written Opinion in Application PCT/US2007/001101, mailed Jun. 27, 2007, 8 pgs.

Russian Notice of Allowance in Application 2008136867, mailed Jun. 28, 2011, 7 pgs.

Singapore Notice of Grant in Application 200806119-4, mailed Apr. 29, 2011, 3 pgs.

U.S. Appl. No. 11/375,961, Amendment and Response filed Nov. 6, 2009, 12 pgs.

U.S. Appl. No. 11/375,961, Amendment and Response filed Apr. 20, 2010, 11 pgs.

U.S. Appl. No. 11/375,961, Amendment and Response filed Sep. 16, 2011, 13 pgs.

U.S. Appl. No. 11/375,961, Notice of Allowance mailed Oct. 12, 2011, 7 pgs.

U.S. Appl. No. 11/375,961, Office Action mailed Jan. 20, 2010, 12 pgs.

U.S. Appl. No. 11/375,961, Office Action mailed Jun. 16, 2011, 10 pgs.

U.S. Appl. No. 11/375,961, Office Action mailed Aug. 6, 2009, 8 pgs.

Japanese Notice of Rejection in Application 2009-500354, mailed May 2, 2012, 2 pgs.

U.S. Appl. No. 11/375,961, Notice of Allowance mailed Apr. 16, 2012, 6 pgs.

U.S. Appl. No. 11/375,961, Notice of Allowance mailed Jul. 9, 2012, 2 pgs.

Japanese Notice of Allowance in Application 2009-500354, mailed Aug. 28, 2012, 6 pgs.

* cited by examiner

EFFICIENT ENCODING OF ALTERNATIVE GRAPHIC SETS

CROSS-REFERENCE TO RELATED APPLICATIONS

This application is a continuation of, and claims priority to, U.S. patent application Ser. No. 11/375,961, (now U.S. Pat. No. 8,422,051), filed Mar. 15, 2006, and entitled "EFFICIENT ENCODING OF ALTERNATIVE GRAPHIC SETS." The disclosure of the above-identified application is hereby incorporated by reference in its entirety as if set forth herein in full.

BACKGROUND

As computerized systems have increased in popularity, so have the needs to distribute files and processing resources of computer systems in networks both large and small. In general, computer systems and related devices communicate information over a network for a variety of reasons, for example, to exchange personal electronic messages, sell merchandise, provide account information, and so forth. One will appreciate, however, that as computer systems and their related applications have become increasingly more sophisticated, the challenges associated with sharing data and resources on a network have also increased.

Some current ways for distributing resources within an organizational network might involve a centralized server (or local device) sharing resources with one or more clients (or remote devices) that typically do not have such resources installed locally. Such systems normally use a dedicated protocol such as Remote Desktop Protocol ("RDP"), Independent Computing Architecture (ICA), and others, to share various applications with a remote client. With such protocols, a client computer system can access a centralized network server, which hosts resources of interest, and interact (e.g., sending mouse and keyboard events, etc.) with those resources just as though those resources were installed locally.

The network server in turn, processes those interactions, creates corresponding rendering information of the data, and sends both the processed data and created rendering information back to the client. The client computer system then receives the data and rendering information, and uses a client-side video driver to render and display the received data locally. Ideally, this interaction between the client computer system and network server occurs seamlessly as though the client computer system had actually processed the data locally with its own installed resources. Unfortunately, such systems can be subject to network throughput constraints, which, if burdened, might result in a "lag" between what the local client computer system views in terms of interaction and processing.

Another type of system that is similar in most respects to the centralized sharing model described above involves a broadcasting (or "sending") client computer system configured to send window data information to other recipient client computer systems on a network. This feature is also sometimes called "desktop sharing." In this example, the broadcasting computer (e.g., an "instructor" in a learning environment) and the recipient computer systems (e.g., "students") connect using a commonly-installed application program that allows for sharing of desktop views and locally installed applications at the instructor computer. Similar to the centralized computing system scenario, the client computer systems might be able to interact with the windows displayed at the instructor computer as though the windows were the student computer's own.

Because bitmaps are expensive in terms of bandwidth consumption when transmitted over a network connection (e.g., the Internet), rather then sending the entire bitmaps most systems nowadays (such as those described above) send graphic primitives and other operations, which tell a subroutine on the client side what and how to draw something. For example, a client may be told to draw a rectangle along with information about where it should be drawn, what size, color, etc. For instance, a rectangle may be used to draw a button for a user interface, a border around a document, or any other purpose for which a rectangular shape may be useful. Of course, there are many other shapes and operations that can be used as primitives that may be more sophisticated and require more processing that must be done to transfer and perform the operation on the remote client.

Although the above use of primitives have enhanced the seamlessness of networking systems, as applications continue to get more sophisticated graphical interfaces and other displays, the more processing intensive the use of the above primitives becomes. Moreover, the information sent from the local to the remote device for rendering graphics on the display at the client is typically used in an immediate presentation mode where tiled windows results in loss of graphic information. For example, using immediate presentation mode, only the information needed to draw the visible portions of the widows is available. In other words, there is no graphics information retained for portions of windows in the background covered by other windows—i.e., graphics information is only retained for top level window. Accordingly, when a window is moved to the foreground, new information is needed to draw the window. Because of the above noted increase in graphics sophistication, this continual sending of information may overload the system when frequent updates are need—e.g., when windows are shuffled, rotated, and rearranged. This also presents various challenges as it relates to more sophisticated animations.

BRIEF SUMMARY

The above-identified deficiencies and drawback of current networks are overcome through example embodiments of the present invention. For example, embodiments described herein provide for mechanisms used to efficiently encode and use resources for applications executed on a local device, yet displayed on a remote device. Note that this Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

One example embodiment provides for a mechanism of efficiently encoding graphic objects for display on a remote device for application(s) running on a local device by determining an appropriate encoding mechanism regardless of the type of graphics language used. The mechanism provides for executing application(s) on a local device, each of which generates the graphics display—based on a particular graphics language—for display at a remote device. Further, a graphics set for a particular graphic language is received, which includes resource(s) and/or command(s) used in rendering at least a portion of the graphic display for the application(s). Also received is encoding data that includes information for the following: (1) metadata that describes the contents of fields within the graphics set used for assisting data compression modules to more efficiently compress the graphics set then when the graphics set is in normal form; and/or (2) encoding type data that describes data compression mechanism(s) supported by the remote device for selecting an efficient compression type for the graphics set. Based on the encoding data received, an appropriate encoding mechanism is determined for various portions of the graphics set.

Other example embodiments provide for efficiently rendering graphic objects on a remote display device for application(s) running on a local device by determining what (if any) resources for the application should be sent to the remote device. In this embodiment, application(s) are also executed on a local device, each of which generates graphic displays for transmitting to a remote device. A graphics set that includes resource(s) and/or display command(s) is then received, which can be used to render at least a portion of the graphics display(s) for the application(s). Also received is resource data that includes information for the following: (1) delivery status information for determining if resource(s) corresponding to the graphics set has been sent to the remote device and stored in a central cache for reusability proposes without regard to the type of resource stored; (2) supported application information for determining dedicated resources currently available on the remote device in order to display resource(s) on the remote device for the application(s) without transferring the resource(s) from the local device; (3) system limitation data for determining if portion(s) of a resource should be progressively sent to the remote device such that a degraded version of the full resource is first sent and updates that improve the degraded version are subsequently sent to save on bandwidth or other system limitations; and/or (4) visibility information that describes whether or not resources corresponding to the graphics set can be currently seen by a user at the remote device. Based on the received resource information, portion(s) of the graphic set are selected for encoding.

Another example embodiment provides for efficiently synchronizing rendering data structures used in generating a graphics display on a remote device for applications executed on a local device. In this embodiment, similar to other embodiments, application(s) are executed on a local device, each to of which generates rendering data structure(s) of a particular graphic language, which are retain mode data structures that maintain state for resource(s) and are used to compose a graphics display for the application(s) on a remote device. Thereafter, a graphics set is received that includes resource(s) and/or display command(s) corresponding to the particular graphics language and used in modifying the rendering data structure(s). Further, metadata is received that includes a description of fields for the graphics set in order to assist data compression module(s) to identify a type of structure for the fields common among graphic sets for different graphic languages that the data compression module(s) can more readily recognize and appropriately encode. Based on the received metadata, the fields of the graphics set are encoded for sending to a remote device and synchronizing rendering data structure(s) between the local and remote devices, which are used to compose a graphics display at the remote device for the for application(s).

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantageous features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION

The present invention extends to methods, systems, and computer program products for efficiently remoting graphic sets used in rendering the display of local application(s) at a remote device. The embodiments of the present invention may comprise a special purpose or general-purpose computer including various computer hardware or modules, as discussed in greater detail below.

As a preliminary matter, it will be appreciated and understood that the examples and descriptions herein make reference to MICROSOFT™ terminology for purposes of convenience in various implementations. Such reference to specific terms, however, should not be construed as limiting embodiments herein to specific operation or other type systems. Rather, the elemental functionality described herein can be practice in any computing environment or operation system where the functionality described herein is desired.

As previously mentioned, the above-identified deficiencies and drawbacks of remoting graphic displays of current networks are overcome through exemplary embodiments provided herein. For example, one embodiment provides for field encoding, which is a mechanism used for identifying fields of a graphics set for a particular graphics language such that commonalities of various fields across different graphics languages are identified. Once identified, the redundancy associated or commonality identified across the various data types within the fields of a graphics set can be efficiently encoded. For example, the redundancy or commonality between fields can be eliminated or efficiently compressed by applying one or more of the following techniques: (1) conversion of fields between machine format and network format based on metadata or other information provided for the field; (2) encoding of a field in a variable length (e.g., two/three/four byte encoding); (3) delta encoding, which typically is used for encoding arrays of coordinates where a point can be encoded as a delta relative to the previous point in the array and deltas can be represented in less bytes than the absolute coordinate; (4) inter-order compression, which is used to encode a structure of a certain type based on a previous encoded structure of the same type. Note that the above mechanisms may be currently applied in other protocols (e.g., Remote Desktop Protocol (RDP)); however embodiments provided herein extend the field encoding to other graphical languages other than Graphics Design Interface (GDI)—e.g., Windows Presentation Foundation (WPF) information.

In another embodiment, resource caching is provided such that heterogeneous resources will be treated in a homogeneous way when it comes to storing them. Although current mechanism (such as RDP) allow for storing resources on a client to save bandwidth by reusing them in later operations or commands, the present invention extends the caching mechanism for use in other graphical languages (e.g., other than GDI like WPF). For example, current mechanisms store the types of resources (e.g., glyphs, bitmaps, sprites, etc.) in separate caches, thereby providing a non-extensible approach to reusing of resources. Accordingly, embodiments provide for a more generic and extensible mechanism that provides a central cache for all resources, regardless of their type. As such, the resource may be used multiple times within a rendering data structure or even across data structures for different applications, and thus the resource will only need to be sent once to the remote device and used across various composition sub-structures (e.g., a sub-tree).

In yet another embodiment, the type of encoding or compression for remoting resources or other items within a graphics set may be determined based upon the types of compression mechanisms supported by the remote device. In such an event, available compression mechanisms can be negotiated between the client (i.e., remote device) and the server (i.e., local device) at connection time; however, the exact compression mechanism used by the server to compress a resource will be decided at the time of compression by the local device. Accordingly, the local device will chose one of the negotiated formats based on how well each format compresses the given data. For example, one compression type may various compression techniques can be used on a single resource. The resulting compression mechanism that most efficiently reduces the amount of data may then be used for sending the resource (or other data) to the remote device. Note that the local server can choose either a lossless or lossy compression format based on the various resources or other data to compress.

Still other example embodiments provide for improving responsiveness by rendering with partially sent resources. Accordingly, based on various system limitations such as bandwidth or display device limitations, portions of a resource can be sent along with the full rendering commands for rendering something meaningful by the application. For example, bitmaps or other resources may contain an image compressed with such progressive technique. In such instance, the color image may initially be inaccurate because not all of the data necessary to decompress the full image has arrived at the client. The remote device, however, can use a blurry image or other degraded image for an initial rendering.

By way of example, a button for an application may have a color that is vastly inaccurate, yet still representing the button in a good enough manner to allow a user to interact with the button without waiting for a final version thereof. As more data from the image arrives from the network, the remote device can update the image and re-render the portion of the data structure containing the image. This way, the perceived responsiveness of the user dramatically increases just because in most of the cases the user can use the application without all of the image data being updated. Note that the use of a color downgrade mechanism was used; however, any kind of progressive encoding or interlacing technique can also be used. Further note, that such progressive or interlacing mechanism could be applied to not only bitmaps or other similar resources, but will also work well for images with various arrays such as curves or meshes.

In yet another example embodiment, a mechanism is provided for determining what portions (if any) of a graphics set should be sent to a remote device and in what order. For example, often portions of a graphic display or resource may not be visible to a user. Accordingly, such things as the Z-Order, transparency, the minimize/maximize state, play an effective role in determining if an application or resource thereof will produce an output that is visible to the user. As long as an application or resource thereof is not visible, it may not be necessary to remote the content or resource of that application until a later time. Accordingly, updates can be delayed until bandwidth allows. Further, the local server may prioritize what portions of the rendering data structures or displays will be sent to the remote device based on such visibility information.

Still other embodiments provide for use of dedicated resources on the remote device in order to eliminate the transfer of a resource between the local device and the remote device when rendering such resource. For example, in most cases where graphics data is remoted, resources like borders, title bars, and/or other icons are present on both the server and the remote computer. For instance, if both the remote and local server have the same (or similar) application installed, likely the icons for the local application will be present in the resource portion of the binary for the application on the remote side. In such cases, the local device may be able to instruct the remote device to use these various resources, without the server or local device having to send the resource bytes for it.

Although more specific reference to advantageous features are described in greater detail below with regards to the Figures, embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" can refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

Figure 1A:
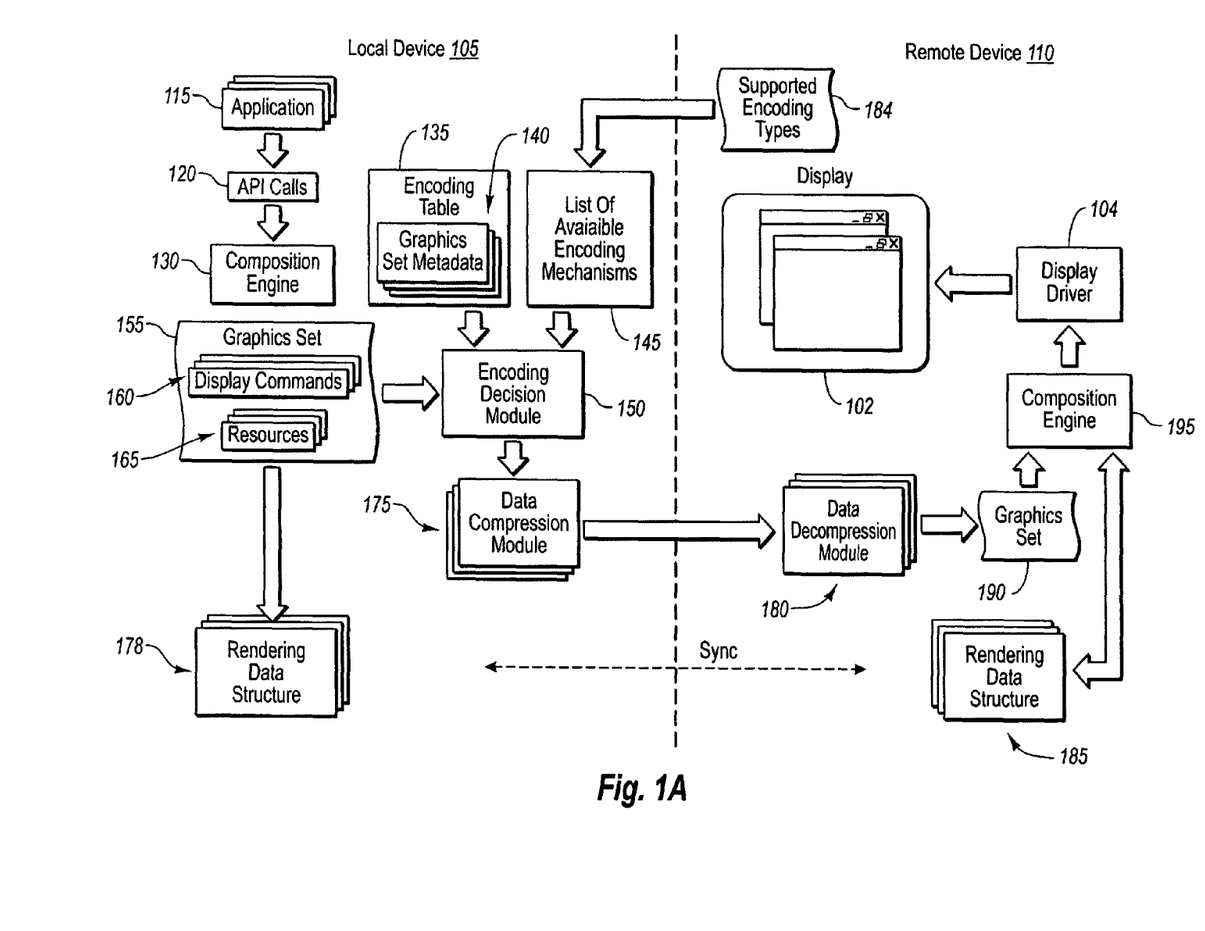
FIG. 1A illustrates a distributed system that uses various information for efficiently encoding graphic sets used in rendering a display at a remote device in accordance with example embodiments.

FIG. 1A illustrates a distributed system used in remotely displaying graphic information for applications on a local device. As shown, applications 115 may be executed on local device 105, which displays are intended for remote device 110. Note that the applications 115 may be anyone of numerous applications such as text editor, spread sheet application or any other well known application. Further, the environment for remote device 110 and local device 105 may be a presentation type environment (e.g., the desktop sharing previously described) or networking system in which a remote device 110 desires to execute applications 115 at the local device 105, yet view and control the applications from the remote device 110 outside of the local device 105 network. As such, communications between the local device 105 and remote device 110 may traverse across any well known network, both local and distributed, e.g., a LAN, the Internet, etc.

Regardless of the type of application or network used to establish a communication channel between the local device 105 and remote device 110, applications 115 can make application program interface (API) calls 120 in accordance with user input received from remote device 110. Such API calls 120 affect the graphics displays of the various applications 115. For example, API calls 120 may be to minimize/maximize the display of an application 115, move icons or other resources within the display, or any number of well known ways of interacting and changing the graphical display for one or more applications 115. Of course, as would be recognized, it is not necessary for an input to come in the form of API calls 120 in order for the graphics displays of the various applications 115 to change. Accordingly, the use of API calls 120 for affecting the graphics displays of the various applications 115 is used herein for illustrative purposes only and is not meant to limit or otherwise narrow the scope of embodiments herein.

Nevertheless when using such calls 120, the API calls 120 can call into composition engine 130, which generates graphics set 155 that can include display commands 160 and/or various resources 165. The display commands 160 may include such information as the type of resource 165, positioning within the display (i.e., x-y coordinates), size and/or shape of the resource 165, or any other well known properties or operations used for displaying various resources 165. The resources 165 also can represent any number of well known icons, text, glyphs, sprites, bitmaps, and other image types. Accordingly, the display commands 160 and resources 165 as described herein should be broadly construed to cover any number of various operations performed on resources as well as any number of image data used for graphical displays of applications 115.

The graphics set 155 are typical used to generate rendering data structures 178 for the various applications 115. In turn, the rendering data structures 178 are used to describe the display of an application 115 and may be a tree like structure, wherein each node represents a resource, property, or relational description thereof. For example, a node within the data tree may represent a button, while other nodes describe color, size, shape, or other properties of the button, while still other nodes represent the relationship and interaction with other components or resources within the display of an application 114. Accordingly, as would be recognized, the graphics set 155, could be used to modify, generate, or otherwise update the rendering data structure 178, which can then be used to compose one or more displays corresponding to applications 115. Note that unlike the immediate presentation modes of other graphics languages described above, the use of the rendering data structures 178, 185 allow for a retention mode, wherein state for the resources is maintained. As will be described in greater detail below, this along with other embodiments described herein allows for many advantageous features.

Note that in one embodiment, it is desirable to synchronize the rendering data structure 178 on the local device 105 with that of a similar rendering data structure 185 on the remote device 110 side. In such instance, example embodiments provided herein can efficiently encode the various graphic sets 155 for updating or modification of the rendering data structure 185 on the remote device 110. It should be noted, however, that although some mechanisms provided herein are used for graphical languages that support rending data structures 178, 185, other embodiments are equally as applicable to graphical languages that do not support such rendering data structures 178, 185. In fact, many of the embodiments described herein are used for a wide variety of graphical languages including, but not limited to GDI, WPF, as well as other known (and potentially unknown) graphical languages. Accordingly, the following discussion of various embodiments should be broadly construed to be applicable across a wide number of graphical languages.

Regardless of the graphical language used to create graphics set 155, note that the encoding decision module 150 typically operates directly on the rendering data structures 178 (i.e., the retained mode composition data structure or tree). The encoding decision module 150 might send the rendering data 178 immediately when an application 115 calls 120 into the composition engine 130 or might send the data 178 at a later time when the network permits. For instance, the application 115 might call 120 into the engine 130 to create a circle. The command 120 might translate into a direct call into the encoding decision module 150 and the later would immediately encode the circle command and send it on the wire. An alternative model might be that the encoding decision module 150 is notified that a circle was added to the rendering data structure 178 (e.g., a composition tree) and let the encoding decision module 150 decide when the data 178 should be sent. The first model can be considered as a "push" model, whereas the second one may be a "pull" model. The difference between the two is simply the moment when the encoding decision module 150 picks up the updates from the rendering data structures 178. While both models work, the push model may be more limited than the pull model. Accordingly, the most efficient update mechanisms may be a hybrid between the two (i.e., the data 178 is pushed to the network as fast as the bandwidth allows, but if there is some network congestion the system will adopt a pull model driven by network availability events).

Regardless of the model used to transfer the data 178, in one embodiment, encoding decision module 150 can use an encoding table 135 with graphics set metadata 140 (also referred to herein as just "metadata") for identifying the various types of fields within a graphics set 155. For example, the metadata 140 may describe various types of fields within the graphics set 160, which encoding decision module 150 can use to appropriately decide how best to encode the various fields for efficient transfer of display commands 160 and resources 165 to the remote device 110. More specifically, the metadata 140 may be used to identify different types of data structures for fields common among the plurality of graphic sets 155 for different graphic languages. Such information may then be used to assist data compression modules 175 to more readily recognize and appropriately encode the different fields of the graphics set 155.

For example, the display commands 160 may have strings or other binary representations that include the type of resource, positioning (e.g., x-y coordinates), color, or other information traditionally stored or serialized in machine format. Accordingly, the metadata 140 can be used to recognize these fields as strings being stored in machine format, which can then be convert into a network format. For instance, a coordinate (or other string or binary field) will typically be kept as a machine size word in the graphics set 155 on the local device 105 used for rendering, but a machine word is in most cases two to four times bigger then the actual byte size necessary to store such coordinate. In such case, the machine word should be converted to a smaller size and placed in the network packet, thereby allowing data compression modules 175 to more efficiently encode these fields prior to transmission to the remote device 110.

Note that other embodiments use the graphics set metadata 140 to describe other fields or resources within the graphic set 155 for identifying the most efficient mechanism for compression. For example, encoding decision module 150 can use the metadata 140 for determining the type of resource 165 in order to choose a data compression module 175 that can most effectively compress such information. For instance, some bitmaps are best compressed using a run-length encoding (RLE) mechanism. Accordingly, the metadata 140 can be used to identify a resources 165 as a bitmap and an appropriate RLE may be chosen to appropriately encode such resource.

Of course, there are many other types of resources 165 and fields for display commands 160 that can be identified and appropriately encoded based upon the graphics set metadata 140 provided. For example, one field may be identified as best encoded in a variable length format, while another may be better suited for a delta encoding (e.g., coordinates where a point can be encoded as a delta relative to the previous point in an array and deltas can be represented in less bytes than the absolute coordinate). Other examples may include inter-order compression, which is typically used to encode a structure of a certain type based on a previously encoded structure of the same type. Of course, as will be recognized, the metadata 140 can be used to describe any number of various display commands 160 and resources 165, such that numerous compression modules 175 can be appropriately chosen by encoding decision module 150 as needed. Accordingly, the above use of particular types of data for encoding, or any particular type of encoding herein described, is for illustrative purposes only and is not meant to limit or otherwise narrow embodiments herein.

Note that although the metadata 140 is shown in encoding table 135 separate from the graphics set 155, other embodiments also contemplate the metadata 140 as part of the graphics set 155. In addition, it is noted that arrangements of various modules as described herein can be combined and/or separated into other configurations and/or schematic layouts. Accordingly, the schematic layout as shown in the various figures, as well as the modules or components described herein, are used for illustrative purposes only and are not meant to limit or otherwise narrow the scope of the various embodiments unless explicitly claimed.

Also note that the metadata 165 can be runtime information or compile time information. For example, an eXtensible Markup Language ((XML) or other suitable binary format) document may include metadata 165 that is exchanged at runtime. The difference between the two is the fact that the runtime information is typically pushed by the composition engine 130 through a specific function call that allows the metadata file (e.g., an XML document) to be passed into the encoding decision module 150. Typically, the runtime metadata 165 is pushed only once, at initialization time. From that point on, the composition or rendering engine 130 does not have to fully describe the graphics set 155 to the encoding decision module 150 each time it calls into the encoder. Instead, the composition engine 130 simply has to prefix (or identify) each order (i.e., display command and/or resource) in the stream with the well defined type defined in the initial metadata 165 exchange. The examples below might help.

For example, assuming that the metadata 165 is exchanged at runtime, the metadata 165 might look like the following XML file.

```
<GFXMETADATA>
    <ORDERMETADATA TYPE="1>
        <FIELD TYPE="FLOAT"/>
        <FIELD TYPE="FLOAT"/>
    </ ORDERMETADATA >
    < ORDERMETADATA TYPE="2">
        <FIELD TYPE="SIGNED INTEGER" MIN_VAL="-255" MAX_VAL="255"/>
        <FIELD TYPE=" UNSIGNED INTEGER" MIN_VAL="-4096" MAX_VAL="4096"/>
        <ARRAY>
            <FIELD TYPE="COORDINATE" MIN_VAL="0" MAX_VAL="65535"/>
        </ARRAY>
    </ ORDERMETADATA >
</GFXMETADATA>
<ORDER TYPE="1"/>
    <VAL>12.8</VAL>
    <VAL>21.1<VAL>
</ORDER>
<ORDER TYPE="2"/>
    <VAL>200</VAL>
    <VAL>3993</VAL>
    <VAL LENGTH="3">
        <VAL>100</VAL>
        <VAL>200</VAL>
        <VAL>300</VAL>
    </VAL>
</ORDER>
```

Note that in the GFXMETADATA structure above two order types are declared. The first one is an order type that includes two floating point numbers. The second one is an array that includes one signed integer, one unsigned integer, and one array of coordinates. This metadata should be communicated to the encoding decision module 150 at initialization time. After the initialization, the second structure (ORDER) can be used to send orders to the encoder 150. Note how the second structure does not describe the types, just the values. Even in the XML representation, it can be seen that by splitting the metadata from the second data structure (ORDER) less info is needed to communicate to the encoding decision module 150 the content for an order. Metadata 140 is very static so it makes sense to be communicated only once. The order data, on the other hand, is dynamic data and typically should not have attached any static info to it. Such benefit is more dramatically noticeable when a binary format (as described below) is used for both data and metadata instead of XML. The encoder or encoding decision module 150 can just look at the order type and it will know based on the metadata description how to encode the values.

For example, other files (e.g., an Interface Definition or Description Language (IDL) file) represent a compile time contract between the encoder 175 or encoding decision module 150 and the composition engine 130. If the contract is changing, the two components have to be recompiled using the common (e.g., IDL) file. Using the common file ensures that the devices operate on the same binary data structure formats. Note, however, that describing the data at compile time will probably result in a faster operation of the encoder decision module 150 (as described above) since the encoding code itself will be generated directly from the graphics data description. Nevertheless, the compile time description vastly depends on the language used. For example, in C and C++ a set of macros can be used to define the graphics primitives. By using macros one can define both the machine format structure and the encoding or network code itself.

Once the appropriate data compression 175 has encoded one or more fields within the graphics set 155, these fields (or graphics set 155) are sent to the remote device 110 where they are decompressed using module 180 and regenerated, as shown in graphics set 190. As such composition engine 195 can use these to generate a rendering data structure 185 that is in sync with the rendering data structure 178 on the local device 105. Further, this rendering data structure 185 can then be composed such that the display driver 104 can generate the appropriate display 102 representing the displays of the applications 115 from the local device 105. Accordingly, as the user on the remote device 110 interacts with display 102 different graphic sets 155 can be generated and encodes as previously described for synchronizing the rendering data structures 178, 185.

In another exemplary embodiment, the type of encoding or data compression module 175 chosen may be based upon those supported encoding types on the remote device 110. For example, during an initialization of the connection (or at some other time thereafter), the types data compression may be negotiated between the local device and the remote device 110. Accordingly, as shown, remote device 110 sends supported encoding types 184, which may then be included in a list of available encoding mechanisms 145. This list of available encoding mechanisms 145 can then be used by encoding decision module 150 in choosing the appropriate data compression module 175 for compressing fields within the graphics set 155 as previously described.

Note that although the available encoding mechanisms 145 are negotiated between the remote device 110 and the local device 105 typically at connection time, the exact compression mechanism used by the local device 105 to compress portions of a graphics set 155 will be decided on-the-fly at the time of the compression. Accordingly, the remote device 110 will not have prior knowledge as to the exact type of data compression 175 that will be used. Nevertheless, because the supported encoding types 184 are determined before hand, the local device 105 can be assured that the use of any such supported encoding types 184 can be handled by the remote device 110. Further note that the list of available encoding mechanisms 145 may also be based upon those available on the local device 105 as well. In other words, the data compression modules 175 and data decompression modules 180 need to have common types among them.

Also note, as contemplated herein, any well known type of encoding mechanism may be used (e.g., RLE, MPEG based, JPEG, GIF, ZIP, LZ based, JBIG, DejaVu, or other well known pattern or statistical based compression mechanism that are either lossless ore lossy compression formats). Also note that one or more of the fields within a graphics set 155 may be encoded using a hierarchical relationship of the various encoding or data compression modules 175 in order to most efficiently compress the data for sending over the network to the remote device 110.

Figure 1B:
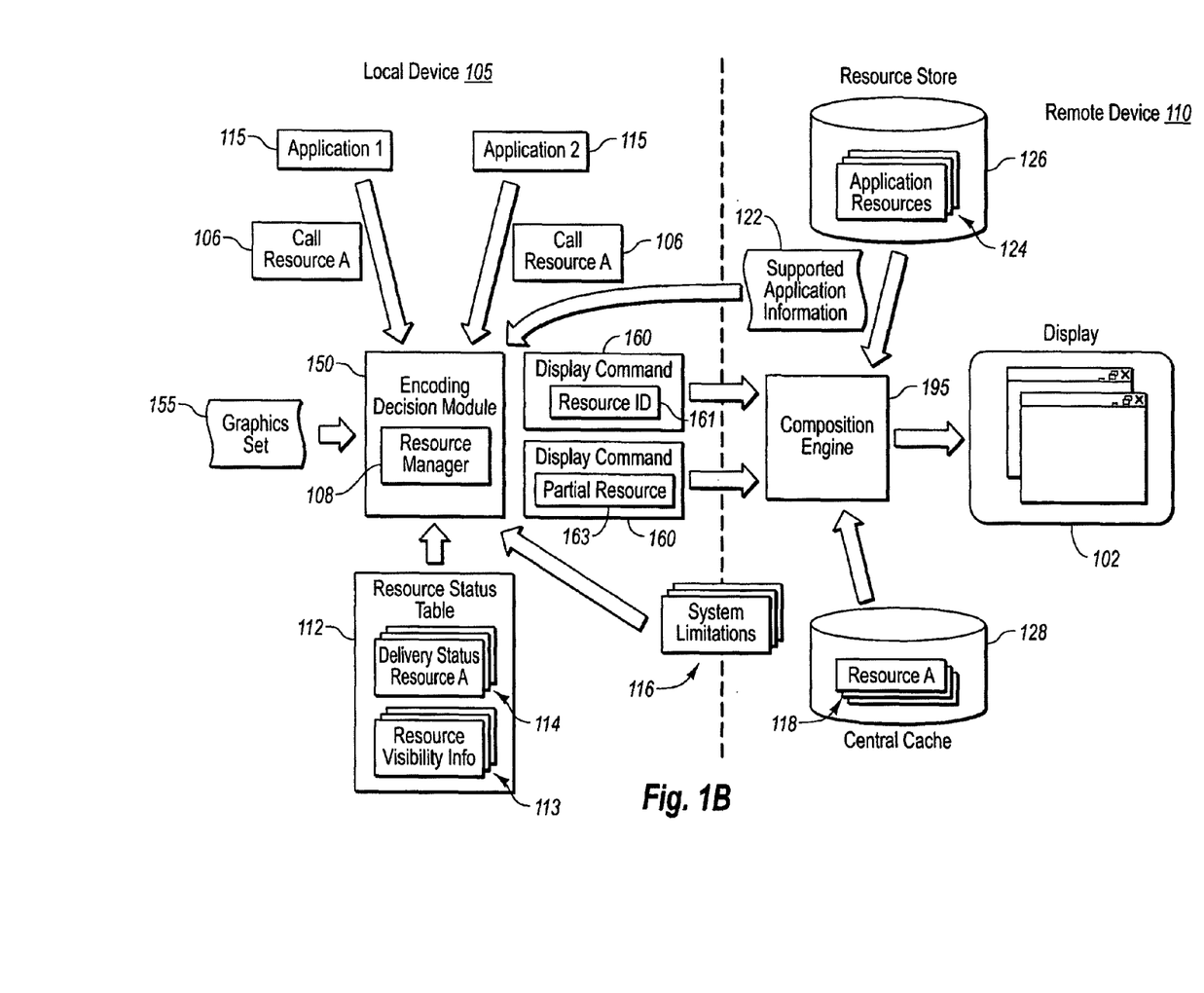
FIG. 1B illustrates a distributed system that utilizes information about various resources for determining what portions of resources (if any) should be encoded for transmission to a remote device in accordance with example embodiments.

FIG. 1B illustrates a similar distribution system as previously described with both a local 105 and remote device 110. It should be noted that FIG. 1B is a simplified version of the system previously mentioned; and therefore is shown with missing components or modules to simplify the schematic diagram. In the embodiments described therein, however, rather then determining what encoding types should be used for encoding graphic sets 155, various mechanisms are used for choosing resources (if any) to send to the remote device 110. In one such embodiment, application resource caching is provided wherein heterogeneous resources will be treated in a homogeneous way when it comes to storing them.

For example, a first application (e.g., Application 1) 115 can make a call for resource "A" 106. As resources are sent across the network to the remote device 110, the delivery status of such resources can be stored in resource table 112 (which in this case shows the delivery status of resource "A" 114 as already transferred). On the remote device 110, resource "A" 106 will be stored in a central cache 128 as shown in the list of resources 118 therein. Accordingly, next time the application 115 desires to use resource "A" 106, rather than sending the resource to the remote device 110, resource manager 108 will identify the resource as already being sent, and simply provide a display command 160 with the resource ID 161 for sending to the remote device 110. In other words, the resource (in this case resource "A" 106) only needs to be sent once throughout the connection between the local 105 and the remote 110 devices and can be repeatedly used for across various different applications (e.g., application 2 that also calls resource "A" 106).

Note that although some caching mechanisms used by certain protocols (e.g., RDP) allow for caching of resources, such caches are typically separated based upon the types of resource used (e.g., glyphs, bitmaps, sprites, etc.). Although such mechanisms can be as efficient as the more generic central caching mechanism provided herein, these approaches are non-extensible. By providing a central cache 128 to store all resources 180, the present invention extends the ability to use such resources 106 across various applications 115 and across different rendering data structures 178, 185 that may be used. For example, a generic caching mechanism provided herein (using, e.g., RDP) has the added benefit of a resource being sent only once and used by multiple nodes in a composition structure or tree. For instance if an icon is used by multiple applications 115, that icon will be present in each of the composition sub-trees (or rendering data structures 178, 185) corresponding to those applications 115.

Without such caching mechanism, the resource would need to be sent to the remote device 110 for each node that is using it. With the central storage mechanism provided herein, however, a resource 165 is sent only once the first time the resource 165 is added to a node and used by multiple nodes in a composition data structure. Also note that the local device 105 and remote device 110 may or may not use mechanisms that limit the memory fragmentation caused by caching resources with vastly different sizes. Moreover, it should be noted that because the non-extensible approach may still provide an efficient mechanism for accessing resources, such approach may be used in conjunction with the generic caching provided herein.

In yet another example embodiment, a mechanism is provided for improving responsiveness by rendering with partially sent resources. In such instance, system limitation 116 such as bandwidth, or display limitations on the remote device 110 may be identified by the encoding decision module 150 that includes resource manager 108. Based upon such system limitations 116, resource manager 108 may determine that only partial resources 163 should be sent in display commands 160 for graphics set 155 as previously described. More specifically, typically there are two pieces of information necessary for rendering a graphics set 155. The first part, shown herein as display commands 160, describes the actual rendering operations for a resource 165. Typically, they contain instructions about how and what resource 165 should be used for rendering. The second part, represents the resource 168 used for rendering.

As can be seen, rendering or display commands 160 are typically necessary to be sent in full to the client or remote device 110 before rendering can begin. This, however, is not the case with resources 165. A resource 165 does not always have to be 100% available when the rendering starts for something meaningful to be rendered by an application 115. For example, an initial bitmap resource 165 may contain an image compressed with a progressive technique. For instance, the image color may be initially inaccurate do to various bandwidth limitations or other considerations. Nevertheless, the remote device can use this blurry, off colored, or otherwise degraded image for rendering on the remote device.

Take for instance the case where the resource 165 may be a button, while the color may be vastly inaccurate or some other degradation can be seen, the representation of the button may be sufficient enough to allow a user to interact with the button without waiting for a final version thereof. Nevertheless, as more data from the image arrives from the network, the remote device 110 can update the image or rendering data structure 185. Accordingly, the perceived responsiveness by users is dramatically increased in the case that most users can use the application without all of the resource 165 present. Note that the example uses a color downgrade technique, but any kind of progressive encoding or interlacing mechanism could equally be used.

Also note that this partial rendering mechanism may work well for retain mode systems, but may not work as good for other models (e.g., GDI). The reason being that in the retained mode once the rendering data structure 185 (e.g., composition tree) is updated with the improved resource 165, all of the information is on the remote side 110 to trigger a redraw. In other non-retained models (e.g., the GDI model), however, there may be no mechanism to re-compose on the remote 110 side, so in the case where drawing occurs with an inaccurate resource typically there are not mechanisms to refresh the drawing until the local 105 or server side uses that resource 165 again in a drawing operation. Nevertheless, even in the non-retain model, there might be cases where it is preferable to render using inaccurate resources 165 than wait for the whole resource 165 before rendering something.

Figure 1C:
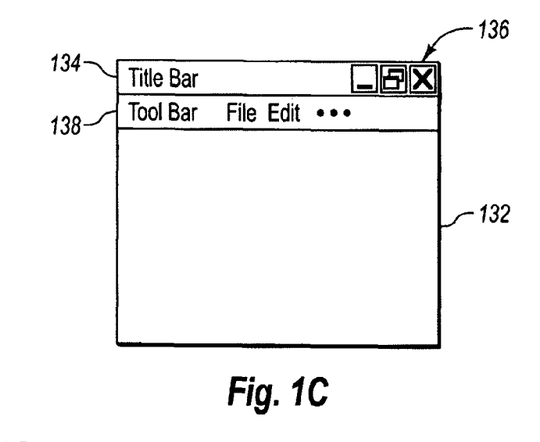
FIG. 1C illustrates some of the dedicated resources or icons that may be available on a remote device and used such that there is no transfer of the resources from a local device in accordance with exemplary embodiments.
Figure 1D:
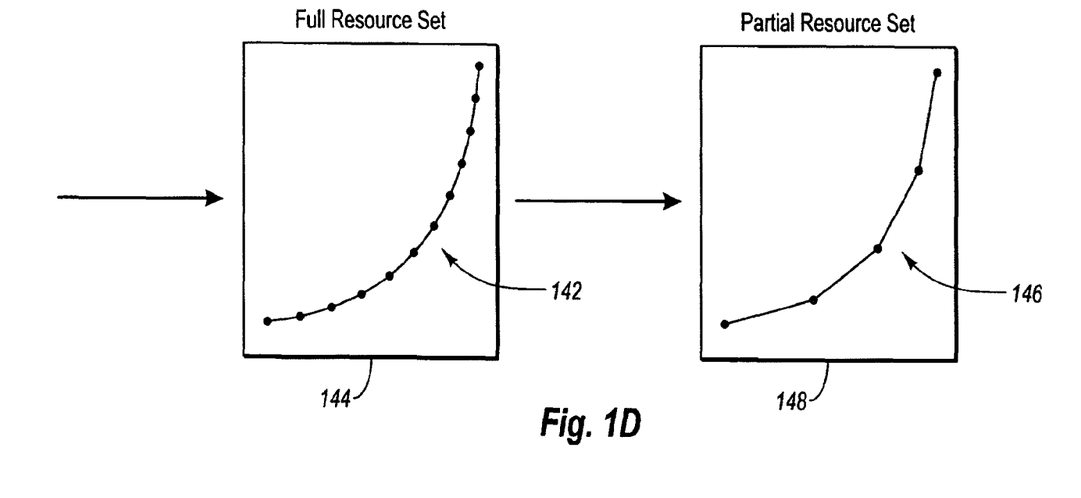
FIG. 1D illustrates a mechanism for improving responsiveness by rendering with partially sent resources in accordance with example embodiments.

FIG. 1D illustrates the above embodiment using an array of coordinates displayed in a curve 142. As shown, the full resource set 144 includes numerous points along the curve 142. Embodiments, however, can use system limitation 116, to decide that only a partial resource set 148 should be sent. For example, only a fraction of the points along the curve 146 are sent in this example which while not representing the curve exactly 142 still allow a reasonable depiction of the overall image. In other words, the exact curve 142 is approximated from a multitude of points, each point representing a digital sample for that curve, wherein the more samples that are present, the more accurate the curve will look. Depending on the curve 142, however, a close enough representation 146 can be rendered using only a fraction of the number of samples. The rest of the points can be updated a later time. As updates arrive from the local device 105, the remote device 110 will update the set of points for that curve 142 and re-render the data structure 185 that uses it. With each update; the rendering curve 146 will get closer and closer to the final intended shape 142.

Note that although the above example uses a graphical curve or mesh and a simple button, more sophisticated resources 165 can also utilize this feature. For example, an image in final form as a 3-D object may be initially presented in partial form as a 2-D object. As bandwidth becomes available, more and more information can be sent to update the image to its final 3-D form. Of course, as will be recognized, there are many various resources 165 and mechanisms (i.e., how and what portions of a resource to send) that can utilize this feature. Accordingly, the above examples are used herein for illustrative purposes only and are not meant to limit the scope of these and other embodiments.

In yet another example embodiment, resource manager 108 can determine or identify those resources that are dedicated on both the local device 105 and the remote device 110. Accordingly, supported application information 122 can be transferred to the local device 105 upon initialization of the connection (or at sometime thereafter). This information will typically include application resources 124 supported and stored in resource store 126 on the remote device 110. This supported application information 122 can then be used by the resource manager 108 in determining what types of resources should be sent to the remote device 110.

For example, both the remote 110 and the local device 105 may have a specific application (e.g., a specific type of text editor) installed. Accordingly, the icons or other application resources 124 associated therewith will also be located on the both devices 105, 110. In these cases, local device 105 may simply use display command 160 and resource ID 161 to instruct the remote device 110 to use the appropriate icons, without the local device 105 actually having to send the resource 124 for it. Note, however, that such model assumes that resources 124 are stored in serialized form. They may be transformed as necessary, but the transformation typically takes place at the hardware layer. Accordingly, for protocols or graphics languages that do not transform the resource, it is possible for the local device 105 to communicate to the client well known resource IDs 161 instead of sending the data for the resources 124 over the wire. Such usage of dedicated application resources 124 on the remote device 110 is particularly advantageous in instance where resource 124 sizes are large.

It should also be noted that the exact resource 124 does not need to reside on both the local 105 and remote 110 devices. For example, some applications 115 have resources 124 that are common among several applications 115. For example, most applications 115 have a border, title bar, and widow commands for minimizing/maximizing, full/partial screen, and/or close icons. As such, the application resources 124 used on the remote device 110 do not necessarily need to correspond to an exact application 115 on the local machine 105, although typically it will be the case that they do.

FIG. 1C shows the use of various resources that can be used or that are dedicated on both the local device 105 and the remote demote device 110. In this example, the border 132 resource may be used to outline the application display window. Further, the title bar 135 as well as the window manipulation icons 136 may also be application resources 124 that can be accessed and used on the remote device 110. Similarly, a toolbar 138 with various components or icons can also be utilized. Nevertheless, the information that is manipulated or otherwise changed on the local device 105 will need to be sent across the wire by embodiments previously described.

In still other example embodiment, the above encoding and other resource selection mechanisms can be implemented as part of a single component. The interface (or contract) between this component and the application or composition engine can be defined by an interface definition language like IDL or XML. Nevertheless, the contract is to provide the encoding decision module 150 with both resource 165 data and the metadata 140 necessary for efficiently encode the resource 165. In this way, a change in the resource 165 layout or organization will not require an update to encoding decision module 150. Only an update to the metadata 140 will be required, which can be accomplished by changing the interface or contract.

The present invention may also be described in terms of methods comprising functional steps and/or non-functional acts. The following is a description of steps and/or acts that may be performed in practicing the present invention. Usually, functional steps describe the invention in terms of results that are accomplished, whereas non-functional acts describe more specific actions for achieving a particular result. Although the functional steps and/or non-functional acts may be described or claimed in a particular order, the present invention is not necessarily limited to any particular ordering or combination of steps and/or acts. Further, the use of steps and/or acts in the recitation of the claims (only) is used to indicate the desired specific use of such terms.

Figure 2:
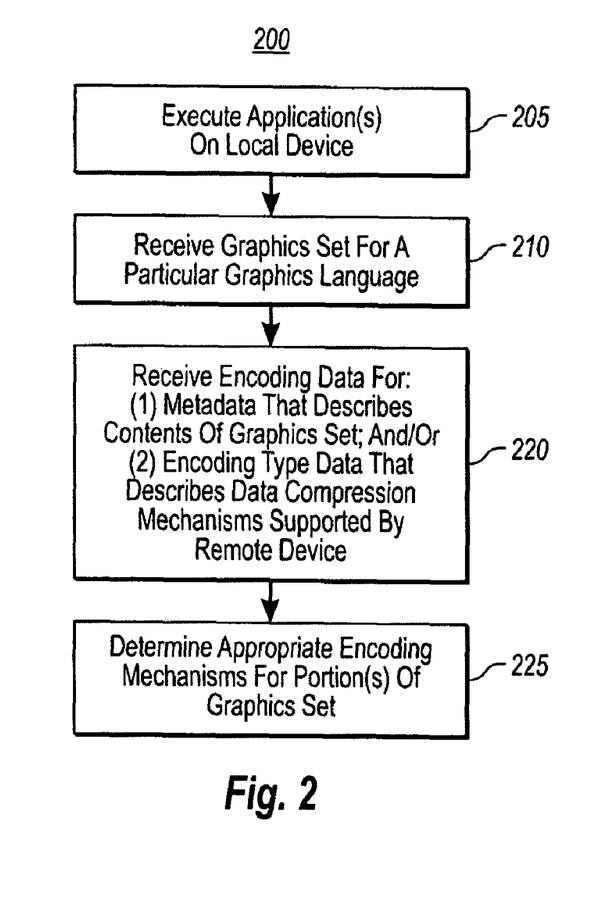
FIG. 2 illustrates a flow diagram for a method for efficiently encoding graphic objects for display on a remote device in accordance with example embodiments.
Figure 3:
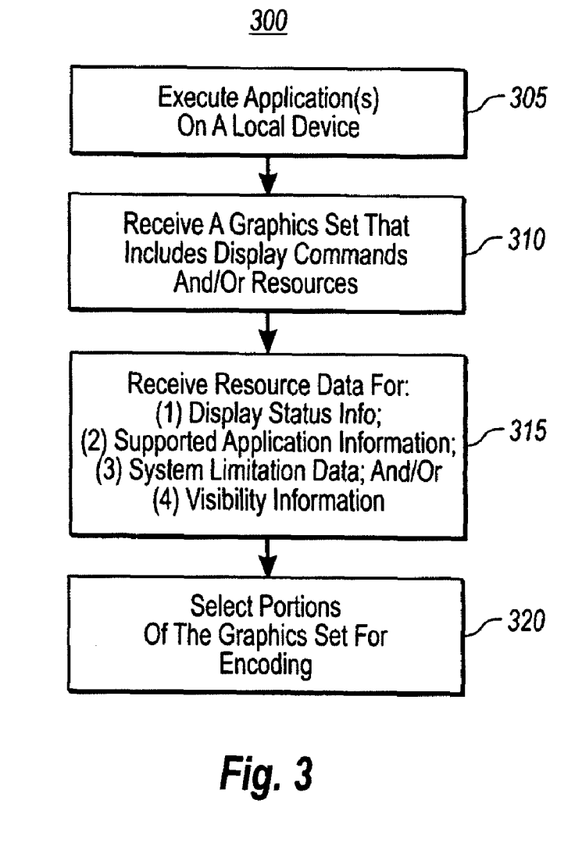
FIG. 3 illustrates a flow diagram for a method of efficiently rendering graphic objects on a remote display device in accordance with example embodiments.
Figure 4:
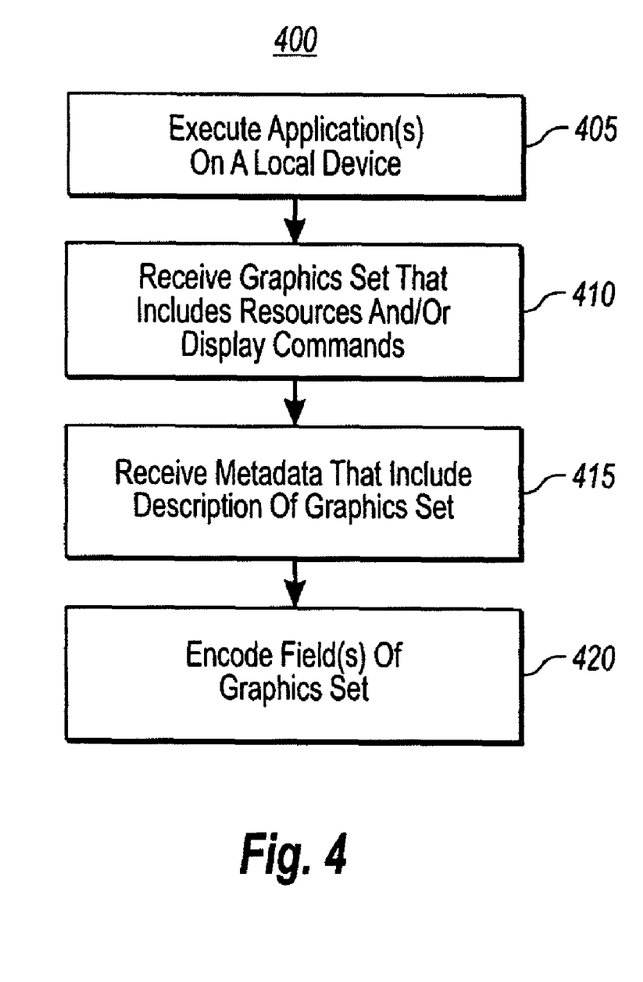
FIG. 4 illustrates a flow diagram for a method of efficiently synchronizing rendering data structures used in generating a graphics display on a remote device in accordance with example embodiments.

As previously mentioned, FIGS. 2-4 illustrate flow diagrams for various exemplary embodiments of the present invention. The following description of FIGS. 1-4 will occasionally refer to corresponding elements from FIGS. 1A-D. Although reference may be made to a specific element from these Figures, such references are used for illustrative purposes only and are not meant to limit or otherwise narrow the scope of the described embodiments unless explicitly claimed.

FIG. 2 illustrates a flow diagram for a method 200 of efficiently encoding graphic objects for display on a remote device for applications running on a local device by determining an appropriate encoding mechanism regardless of the type of graphic language used. Method 200 includes an act of executing 205 application(s) on a local device. For example, applications 115 may be executed on local device 105, wherein the applications 115 generate a graphics display—based on a particular graphics language—for display at a remote device 110. Such graphics language may include GDI, WPF, or other types of currently known or future graphic languages.

Method 200 also includes an act of receiving 210 a graphics set for a particular graphics language. For example, encoding decision module 150 may receive graphics set 155 for a particular graphics language, wherein the graphics set 155 includes display command(s) 160 and/or resource(s) 165. Such graphic sets 155 will be used for rendering at least a portion of the graphics display for the applications 115 on a remote device 110. Note that these display commands may include properties that describe a resource in terms of position on a display, size, color, shape, etc. Further note, that the resources may be anyone of well known resources such as glyphs, icons, sprites, bitmaps, or any other image.

In addition, method 200 includes an act of receiving 220 encoding data for: (1) metadata that describes contents of the graphics set; (2) encoding type data that describes data compression mechanisms supported by the remote device. For example, encoding decision module 150 may receive the graphics set metadata 140 that describes contents of fields within the graphics set 155 used for assisting data compression modules 175 to more efficiently compress the graphics set 155 then when the graphics set 155 is in normal form. Note that this normal form may be in a serialized or un-serialized form. Alternatively, or in conjunction, encoding decision module 150 may receive a list of available encoding mechanisms 145 supported by the remote device 110. This encoding type data will describe the data compression mechanisms supported by the remote device 110 for selecting an efficient compressing type for the graphics set 155 as previously described.

Based on the encoding data received, method 200 also includes an act of determining 225 an appropriate encoding mechanism for portions of the graphics set. For example, based upon the metadata 140 and the list of available encoding mechanisms 145, encoding decision module 150 can determine what data compression modules 175 will most efficiently encode various portions of graphics set 155.

FIG. 3 illustrates a method 300 of efficiently rendering graphic objects on a remote display device for applications running on a local device by determine what (if any) resources for the application should be sent to the remote device. Method 300 includes an act of executing 305 application(s) on a local device. For example, applications 115 may be executed on local device 105, each of which generates graphic displays for transmitting to remote device 110. Method 300 also includes an act of receiving 310 a graphics set that includes display command(s) and/or resource(s). For example, encoding decision module 150, in conjunction with resource manger 108, may receive a graphics set 155 that includes resources 165 and/or display commands 160, which are to be used in rendering at least a portion of the graphic displays for the applications 115 on remote device 110.

Method 300 also includes an act of receiving 315 resource data for: (1) delivery status information; (2) supported application information; (3) system limitation data; and/or (4) visibility information. More specifically, resource manager 108 may receive resource data for determining the delivery status of a resource 165. For example, resource status table 112 can be used by the resource manager 108 for determining the delivery status of resource, corresponding to the graphics set 155, in order to determine if the corresponding resource (e.g., resource A114) has been sent to remote device 110 and stored in central cache 128 for reusability purposes without regard to the type of resource stored. In other words, resources of various types are stored within the central cache 128 such that heterogeneous resources will be treated in a homogeneous way when storing them. Note that the local device 105 and remote device 110 may or may not use mechanisms that limit the memory fragmentation caused by caching resources with vastly different sizes.

Further, encoding division module 150 or resource manager 108 may receive supported application information 122 for determining dedicated resources 124 currently available on the remote device 110 in order to display such resource without transferring the resource from the local device 105. In other words, if both the remote device 110 and the local device 105 have a similar or same application installed, resources or icons can be identified that are dedicated on the remote device 110 and displayed such that those resources don't have to be sent from the local device 105 to the remote device. Such dedicated resources may include a border, a title bar, a toolbar, or some other form of icon or resource standard across both applications.

Moreover, encoding decision module 150 or resource manager 108 can also receive system limitation information 116 for determining if portions of a resource should be progressively sent to remote device 110, such that a degraded version of the full resource is first sent and updates that improve the degraded version are subsequently sent to save on bandwidth or other system limitations. For example, as shown in FIG. 1D, at full resource set 144 that shows a curve 142 with a high sampling may be first sent as partial resource set 148 that only includes a fraction of the total sampling set as shown from curve 146. Note that the partial resources that are progressively sent to the remote device may include bitmaps, curves, meshes, or other image forms. Also note that the degraded version includes inaccuracies of color, detail, number of sample points, or other image quality degradation, but the degraded version of the resource should include enough information to allow a user at the remote device 110 to recognize the resource. Further note that the resource may be a button, checkbox, or other interactive item, and the user should still able to interact with the item without receiving the full resource.

In addition, encoding decision module 150 or resource manager 108 may receive visibility information 113 from a resource status table 112 that describes whether or not one or more resources 165, corresponding to the graphic set 155, can currently be seen by a user. Such visibility information may include information about a Z-Order, transparency, minimize/maximize state of the resource, etc. Accordingly, resources that may not be visible may be delayed in sending to the remote device 110 until bandwidth allows or until needed for viewing.

Based on the received resource information, method 300 includes an act of selecting 320 portions of the graphic set for encoding. In other words, based upon the above delivery status, supported application information, system limitation data, and/or visibility information, portions of the graphics set 155 (i.e., fields of the display command or portions of the resources) will be selected for encoding using data compression modules 175.

FIG. 4 illustrates a method 400 of efficiently synchronizing rendering data structures used in generating a graphics display on a remote device for applications executed at a local device. Method 400 includes an act of executing 405 application(s) on a local device. For example, as previously described, applications 115 may be executed on local devise 105, each of which generates rendering data structures 178 of a particular graphics language, which are retain mode data structures that maintain state for resources 165 and are used to compose a graphics display for applications 115 on remote device 110.

Method 400 also includes an act of receiving 410 a graphics set that includes resource(s) and/or display command(s). For example, encoding decision module 150 can receive graphics set 155 that includes display commands 160 and/or resources 165. The display commands 160 may include properties that describe a resource 165 in terms of positioning on a display, size, color, shape, etc.

Method 400 also includes an act of receiving 114 metadata that includes a description of graphics set. For example, encoding decision module 150 may receive the graphics set metadata 140 that includes a description of fields of the graphics set 155 in order to assist the compression modules 175 to identify a type of structure for the fields common among the plurality of graphics sets 155 for different graphic languages that the data compression module 175 can more readily recognize and appropriately encode. For example, based on the metadata 140, the fields may be converted from machine format to network form, which reduces the bit length of the fields for better compression ratio then when in machine form. Further, the metadata 140 may be used for encoding in variable length form or for delta encoding used such that only a change in the resource is sent to the remote device, which can be encoded using less bytes than sending the whole graphics set 155. Moreover, the metadata 140 may be used for an inter-order compression mechanism used to encode the fields of a certain type based on previously encoded structure of the same type.

Note that the metadata 140 may or may not be attached to the graphics set 155. For example, typically the metadata 155 exchange is a one time event that describes the types of graphics set 155 (e.g., orders/commands or resources) used. Then each graphics set 155 can be prefixed with the type (or identifier). The encoding decision module 150 is then able to look at this identifier and choose the appropriate data compression module 175, the appropriate encoding order, etc., based on the initially exchanged metadata 155.

Based on the received metadata, method 400 includes an act of encoding 420 fields of the graphics set. For example, encoding decision module 150 based upon the graphic set metadata 140 that describes the fields within the graphics set 155 can use such data for encoding fields for sending to remote device 105 and synchronizing rendering data structures 178, 185 between the local 105 and the remote 110 devices, which are used to compose a graphics display at the remote device 110 for the applications 115.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. In a distributed computing system, a method of efficiently encoding at least one graphic object for display on a remote device of one or more applications running on a local device by determining an appropriate compression mechanism, the method comprising:

initializing a connection with the remote device, by the local device;

executing one or more applications on the local device, each of which generates a graphics display for display on the remote device;

receiving a graphics set for rendering at least a portion of the graphics display for the one or more applications;

receiving, from the remote device, one or more supported encoding types, wherein the one or more supported encoding types are used by the local device to determine the appropriate compression mechanism of one or more compression mechanisms for compressing one or more fields of the graphics set, wherein the one or more compression mechanisms comprises a run-length encoding (RLE) mechanism, and wherein the one or more supported encoding types are received from the remote device during the initialization of the remote device and the local device;

based on the one or more supported encoding types, determining the appropriate compression mechanism for the compressing of the one or more fields of the graphics set; and sending graphical information to the remote device, the graphical information being associated with a portion of a window, the portion being hidden, wherein when the window is rotated, the portion becomes displayed, sending graphical information to the remote device including:

prioritizing the graphical information based on visibility information for the graphical information on the remote device; and delaying sending at least a portion of the graphical information based on the prioritizing.

2. The method of claim 1, wherein the one or more supported encoding types is included in a list of available encoding mechanisms.

3. The method of claim 2, wherein an encoding decision module uses the list of available encoding mechanisms in determining the appropriate compression mechanism for the compressing of the one or more fields of the graphics set.

4. The method of claim 2, wherein the list of available encoding mechanisms includes only the one or more supported encoding types that is common with one or more compression mechanisms available on the local device.

5. The method of claim 1, wherein the determining the appropriate compression mechanism occurs at the time of the compression of the one or more fields of the graphics set.

6. The method of claim 1, further comprising: selecting a first field of the graphics set for compression by a first compression mechanism; and selecting a second field of the graphics set for compression by a second compression mechanism.

7. One or more hardware computer storage media storing computer-executable instructions that when executed by a processor perform a method for efficiently encoding at least one graphic object for display on a remote device of one or more applications running on a local device by determining an appropriate compression mechanism, the method comprising:

initializing a connection with the remote device, by the local device;

executing one or more applications on the local device, each of which generates a graphics display for display on the remote device;

receiving a graphics set for rendering at least a portion of the graphics display for the one or more applications;

receiving, from the remote device, one or more supported encoding types, wherein the one or more supported encoding types are used by the local device to determine the appropriate compression mechanism of one or more compression mechanisms for compressing one or more fields of the graphics set, wherein the one or more compression mechanisms comprises a run-length encoding (RLE) mechanism, and wherein the one or more supported encoding types are received from the remote device during the initialization of the remote device and the local device;

based on the one or more supported encoding types, determining the appropriate compression mechanism for the compressing of the one or more fields of the graphics set; and sending graphical information to the remote device, the graphical information being associated with a portion of a window, the portion being hidden, wherein when the window is rotated, the portion becomes displayed, sending graphical information to the remote device including:

prioritizing the graphical information based on visibility information for the graphical information on the remote device; and delaying sending at least a portion of the graphical information based on the prioritizing.

8. The one or more computer storage media of claim 7, wherein the one or more supported encoding types is included in a list of available encoding mechanisms.

9. The one or more computer storage media of claim 8, wherein an encoding decision module uses the list of available encoding mechanisms in determining the appropriate compression mechanism for the compressing of the one or more fields of the graphics set.

10. The one or more computer storage media of claim 8, wherein the list of available encoding mechanisms includes only the one or more supported encoding types that is common with one or more compression mechanisms available on the local device.

11. The one or more computer storage media of claim 7, wherein the determining the appropriate compression mechanism occurs at the time of the compression of the one or more fields of the graphics set.

12. The one or more computer storage media of claim 7, further comprising:

selecting a first field of the graphics set for compression by a first compression mechanism; and selecting a second field of the graphics set for compression by a second compression mechanism.

13. A local device comprising:

a processor configured to execute one or more applications on the local device, each of which generates a graphics display for display on a remote device;

the local device being configured to initialize a connection with the remote device;

the local device also being configured to receive a graphics set for rendering at least a portion of the graphics display for the one or more applications;

the local device being also configured to receive, from the remote device, one or more supported encoding types, the one or more supported encoding types being used by the local device to determine the appropriate compression mechanism of one or more compression mechanisms for compressing one or more fields of the graphics set, the one or more compression mechanisms comprising a run-length encoding (RLE) mechanism, and the one or more supported encoding types being received from the remote device during the initialization of the remote device and the local device;

the local device being also configured to, based on the one or more supported encoding types, determine the appropriate compression mechanism for the compressing of the one or more fields of the graphics set; and the local device being also configured to send graphical information to the remote device, the graphical information being associated with a portion of a window, the portion being hidden, wherein when the window is rotated, the portion becomes displayed, being configured to send graphical information to the remote device including:

being configured to prioritize the graphical information based on visibility information for the graphical information on the remote device; and being configured to delay sending at least a portion of the graphical information based on the prioritizing.

14. The local device of claim 13, wherein the one or more supported encoding types is included in a list of available encoding mechanisms.

15. The local device of claim 14, wherein an encoding decision module uses the list of available encoding mechanisms in determining the appropriate compression mechanism for the compressing of the one or more fields of the graphics set.

16. The local device of claim 14, wherein the list of available encoding mechanisms includes only the one or more supported encoding types that is common with one or more compression mechanisms available on the local device.

17. The local device of claim 13, wherein being configured to determine the appropriate compression mechanism includes being configured to determine the appropriate compression mechanism at the time of the compression of the one or more fields of the graphics set.

18. The local device of claim 13, wherein the local device is also configured to select a first field of the graphics set for compression by a first compression mechanism, the local device also being configured to select a second field of the graphics set for compression by a second compression mechanism.

* * * * *